United States Patent [19]
Morio et al.

[11] Patent Number: 5,218,640
[45] Date of Patent: Jun. 8, 1993

[54] VOICE RECORDING AND REPRODUCING APPARATUS

[75] Inventors: Tomokazu Morio, Nara; Atsunori Kitoh, Yamatotakada; Yoshiji Fujimoto, Nara, all of Japan

[73] Assignee: Sharp Kabushiki Kaisha, Osaka, Japan

[21] Appl. No.: 839,087

[22] Filed: Feb. 24, 1992

Related U.S. Application Data

[63] Continuation of Ser. No. 670,389, Mar. 15, 1991, abandoned, which is a continuation of Ser. No. 304,603, Feb. 1, 1989, abandoned.

[30] Foreign Application Priority Data

Feb. 3, 1988 [JP] Japan ................................. 63-25940

[51] Int. Cl.⁵ .............................................. G10L 5/00
[52] U.S. Cl. ....................................... 381/30; 365/45; 360/74.4
[58] Field of Search ................................... 381/29–36; 364/45; 360/74.4

[56] References Cited

U.S. PATENT DOCUMENTS

| | | | |
|---|---|---|---|
| 4,053,712 | 10/1977 | Reindl | 381/30 |
| 4,318,188 | 3/1982 | Hoffmann | 365/45 |
| 4,754,346 | 6/1988 | Takagi | 360/74.4 |
| 4,821,129 | 4/1989 | Culp | 360/74.4 |

*Primary Examiner*—Emanuel S. Kemeny
*Attorney, Agent, or Firm*—Birch, Stewart, Kolasch & Birch

[57] ABSTRACT

A voice recording and reproducing apparatus which includes a voice encoder for encoding a voice signal into a voice code, an address counter, a voice code memory in which the voice code is circulatively stored as specified by the address counter, a discriminator for determining whether the voice signal inputted is a voiced signal or whether the voice signal inputted is a silent signal, and a register for storing an address value of the address counter when the discriminator indicates that the silent signal has changed into the voiced signal. During reproduction, the starting address of the reproduction is determined by a stored address. The stored address represents the address value in the address counter at the time when the discriminator indicates that a silent signal has changed to a voiced signal.

10 Claims, 5 Drawing Sheets

VOICE RECORDING AND REPRODUCING APPARATUS

This application is a continuation of application Ser. No. 07/670,389 filed on Mar. 15, 1991, now abandoned, which was a continuation of application Ser. No. 07/304,603 filed on Feb. 1, 1989 now abandoned.

BACKGROUND OF THE INVENTION

1. Field of the Invention

The present invention relates to a voice recording and reproducing apparatus operable to analyze a voice signal and then circulatively store it in a memory.

2. Description of the Prior Art

A voice recording and reproducing apparatus, hereinafter referred to as a repeatable recording and reproducing apparatus, is well known which can replay information, which has been recorded during a reproduction, from the point where reproduction is specified, by analyzing the voice signal and then storing it circulatively in a voice code memory. Because the repeatable recording and reproducing apparatus have the capability of replay, that is, reproducing the previously recorded information, the voice recorder is widely used as an instrument convenient to practice English conversation.

The operation of the generally available repeatable recording and reproducing apparatus will be discussed briefly.

Figure 9A:
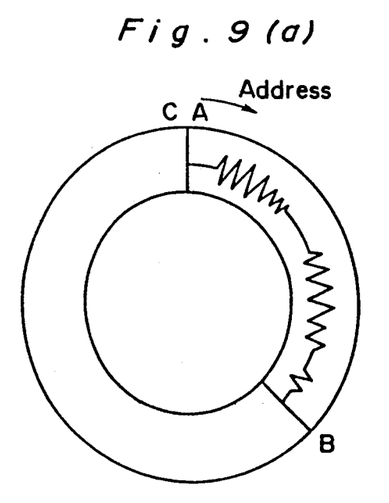
FIG. 9(a) shows a condition in which the repeated recording has just started and the recording of the voice codes has not yet proceeded to the extent that the full capacity of the voice code memory is not completely occupied by the voice codes.
Figure 9B:
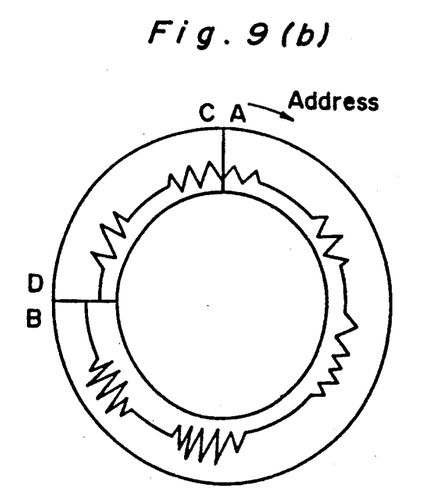
FIG. 9(b) shows a condition in which, consequent upon the repeated recording, the recording of the voice codes has proceeded to the extent that the full capacity of the voice code memory is completely occupied by the recorded voice codes.

FIG. 9 illustrates a schematic diagram showing the voice code memory which has been repeatedly recorded, wherein FIG. 9(a) shows a condition in which the repeated recording has just started and the recording of the voice codes has not yet proceeded to the extent that the full capacity of the voice code memory is not completely occupied by the voice codes whereas FIG. 9(b) shows a condition in which, consequent upon the repeated recording, the recording of the voice codes has proceeded to the extent that the full capacity of the voice code memory is completely occupied by the recorded voice codes. In FIG. 9(a), the next address of the highest available number of the voice code memory concurrently stands for the address of the smallest available number. So far shown in FIG. 9(a), voices are shown as actually recorded in a memory area from the point A to the point B of the voice code memory as indicated by a waveform. If the reproduction is specified at the point B, the information can be replayed from the point A to the point B. (A certain type of the apparatus has a capability of repeating this reproduction.) Thus, no unnecessary portion will be reproduced as the point A is resumed as a starting point for the reproduction when the reproduction is specified.

Referring now to FIG. 9(b) which shows the full capacity of the voice code memory occupied by the recorded information as indicated by a waveform, when the reproduction is specified at the point B, the actual reproduction starts from the point D, which is the address location immediately following the address location of the point B, back to the point B via the points C and A. In other words, when the reproduction is specified, the point from which the actual replay starts is retrogressed from the point, at which the reproduction is specified, a length of time corresponding to the length of time for the voice code memory to be fully recorded.

As described above, in the conventional repeatable recording and reproducing apparatus, the voice codes are circulatively stored in the voice code memory so that, when reproduction or replay is desired, the information is replayed from the address location chosen after a delay of time corresponding to the length of time over which the information recording takes place.

However, it has often experienced that the address location to which the retrogression has been effected, and hence, from which the replay is to be effected, may often be an interim of speech recorded and therefore, a user of the apparatus may be embarrassed to know that the point is not the one desired for the reproduction. In this way, the conventional repeatable recording and reproducing apparatus has a problem in that the first thing that is reproduced may be difficult to listen to or any unnecessary portion may be reproduced.

SUMMARY OF THE INVENTION

The present invention provides an improved voice recording and reproducing apparatus of a type wherein the recording is accomplished by detecting the presence or absence of a silent area during the repeated recording or during the reproduction and cueing on the basis of information representative of the presence of the silent area so that the point from which the reproduction starts will not be an interim of the speech recorded. This allows the user of the apparatus to realize reproduction from a position where the user has desired to start the reproduction.

In order to accomplish the above described object, the voice recording and reproducing apparatus according to a first preferred embodiment of the present invention comprises a voice encoder for encoding a voice signal into a voice code; an address counter; a voice code memory in which the voice code is circulatively stored as specified by the address counter; a discriminator for determining whether the voice signal inputted is a voiced signal or whether the voice signal inputted is a silent signal; and a register for accumulating an address value of the address counter in the event that a result of decision performed by the discriminator indicates that the silent signal has changed into the voiced signal; whereby upon receiving a reproduction instruction, the starting address for the voice code memory is determined by an address stored in a register, which corresponds to a point in time when a silent signal has changed into the voiced signal.

The voice recording and reproducing apparatus according to a second preferred embodiment of the present invention comprises a voice encoder for encoding a voice signal into a voice code; an address counter; a voice code memory in which the voice code is circulatively stored as specified by the address counter; a discriminator for determining whether the voice signal inputted is a voiced signal or whether the voice signal inputted is a silent signal and also for outputting a signal necessary to interrupt an operation of the encoder when the discriminator indicates that the voice signal inputted is a silent signal; a register for accumulating an address value of the address counter when the discriminator indicates that the voiced signal inputted is the silent signal; a silent time length measuring means for measuring a length of time during which the silent signal is present subsequent to the indication by the discriminator; and a silence code write-out means for writing a silence code in the voice code memory; the silence code including a code for indicating that the voice signal inputted is the silent signal, a silent time length, and an address value acquired from the address counter and stored in a register representing the time of the previous silent signal; whereby upon receiving a reproduction instruction, a reverse cued reproduction and a fast-feed cued reproduction of voice can be accomplished on the basis of information of the silence code written in the voice code memory and the address value stored in the register.

According to the first preferred embodiment of the present invention, the discriminator during the recording operations determines if the input voice signal is either the voiced signal or the silent signal. When the result of the determination indicates that the input voice signal is the voiced signal, the voice code which has been encoded by the encoder is circulatively recorded in the voice code memory at the address specified by the address counter. Moreover, if the result of the determination indicates that a silent signal has changed into a voiced signal, the address value in the address counter is stored in a register.

If reproduction is then specified, the voice code recorded at the address stored in the register is reproduced.

Accordingly, when a silent signal is present within a past length of time, the voice reproduction can be accomplished from the the position at which the silent signal has changed into the voiced signal. Therefore, there is no possibility that voice may be reproduced in the interim of speech.

According to the second preferred embodiment of the present invention, the discriminator during the recording operation determines if the input voice signal is either a voiced signal or a silent signal; and when the determination indicates that the input voice signal is the voiced signal, the voice code which has been encoded by the encoder is circulatively recorded in the voice code memory at the address specified by the address counter. Moreover, if the determination indicates that the voiced signal has changed into the silent signal, the operation of the encoder is interrupted in response to the signal fed from the discriminator and the length of time during which the silent signal is present is counted by the measuring means while the address value of the address counter is stored in the register. A silent code is then stored in the voice code memory upon an indication that a voice signal has begun again. This silence code includes a code for indicating that the stored voice signal is the silent signal, a silent time length measured by the measuring means, and an address value representing the start of the previous silent signal, and if there is no previous silent signal, the current address value is stored in the voice code memory, i.e., the address value from the address counter of the start of the current silent signal is stored. The silent code can be written in the voice code memory by the silence code write-out means.

Therefore, during a reproduction, a reverse cued reproduction and a fast-feed cued reproduction of voice can be accomplished on the basis of information of the silence code written, in the voice code memory and the address value stored in the register.

Thus, the start of reproduction may not take place while the speech is in progress, enabling the user to accomplish the voice reproduction from the intended position through a very simple manipulating procedure.

BRIEF DESCRIPTION OF THE DRAWINGS

This and other objects and features of the present invention will become clear from the following description taken in conjunction with preferred embodiments thereof with reference to the accompanying drawings, in which.

DETAILED DESCRIPTION OF THE EMBODIMENTS

Figure 1:
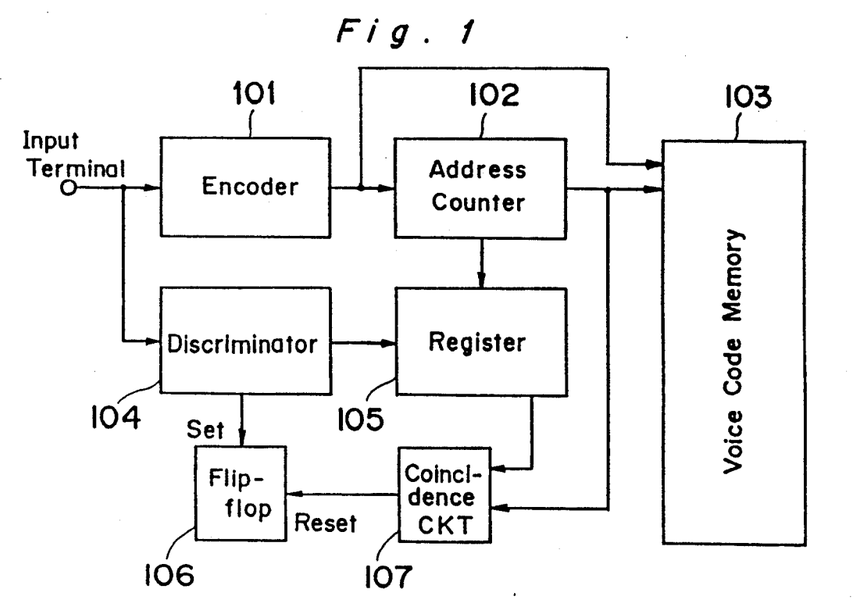
FIG. 1 is a schematic block circuit diagram showing a recording unit used in a voice recording and reproducing apparatus according to a first preferred embodiment of the present invention.

A schematic block circuit diagram of a voice recording and/or reproducing apparatus according to a first preferred embodiment of the present invention is shown in FIG. 1. Referring first to FIG. 1, the voice recording and/or reproducing apparatus, hereinafter referred to a voice recorder, comprises an encoder 101, an address counter 102, a voice code memory 103, a discriminator 104 for detecting the presence of a silent area or a voiced area, a register 105, a flip-flop 106 and a coincidence circuit 107.

The address counter 102 is a type of counter designed to circulatively specify one of the addresses of the voice code memory 103. Each time a voice code outputted from the encoder 102 is written into the voice code memory 103, the count of the address counter 102 is incremented in a quantity corresponding to a bit length of the voice code. The register 105 is designed so as to accommodate address values of the address counter 102.

The discriminator 104 is designed to determine the presence of a silent or voiced area in unit of frame representative of a predetermined length of time and is operable, when a result of discrimination performed thereby indicates that the silent area is superseded by the voiced area, to set the flip-flop 106 and also to output a control signal necessary to cause the count of the address counter 102 to be stored in the register 105.

The voice recorder of the above described construction operates in the following manner. During a recording mode of the voice recorder, a voice signal supplied to an input terminal is supplied to the encoder 101, by which the input voice signal is coded; and also to the discriminator 104. An output signal, that is, a coded voice signal, from the encoder 101 is, based on the value of the address counter 102, written at a predetermined address in the voice code memory 103. It is, however, to be noted that the address counter 102 makes a circulatory access to the voice code memory 103. When a silent signal having a certain length of time is inputted during the recording mode of the voice recorder, the discriminator 104 detects the presence of the silent signal. When a voiced signal followed by the silent signal is subsequently detected, the address counter 102 transfers its count value to the register 105, thereby setting the flip-flop 106 so that the fact of detection of the silent signal can be memorized.

Thereafter, if the recording proceeds with no silent signal inputted, the writing addresses of the voice code memory in the address counter 102 are circulated to the address value which has been previously stored in the register 105 consequent upon the detection of the previous silent signal. In such case, the address value representative of the position of the previous silent signal stored in the register 105 ought to be rendered to be invalid. Accordingly, the flip-flop 106 can be reset when the coincidence circuit 107 detects the coincidence between the respective values counted by the address counter 102 and stored in the register 105.

The operation of the voice recorder which takes place when a reproduction or playback is specified will now be described.

When the reproduction is specified, a decision is first made to determine if the flip-flop 106 is set. If the result of decision indicates that the flip-flop 106 has been set, it means that the presence of the silent area has been detected within the frame of the previous length of time (within the frame of a predetermined length of time stored in the voice code memory 103). Accordingly, the address value representative of the position of the silent signal stored in the register 105 is transferred to an address counter (not shown) of a reproducing unit (also not shown), and a reverse cued reproduction of the voice can be accomplished by making access to the voice code memory on the basis of the address value to reproduce the voice signal. On the other hand, should the result of decision indicates that the flip-flop 106 has not been set, that is, has been reset, it means that no silent area has been detected within the frame of the previous length of time, and therefore, in a similar manner to the repeated recording and reproducing apparatus shown in and described with reference to FIG. 9(b), the voice code can be read out for the reproduction from the address location immediately followed by the address value stored in the address counter at the termination of the recording.

Figure 2:
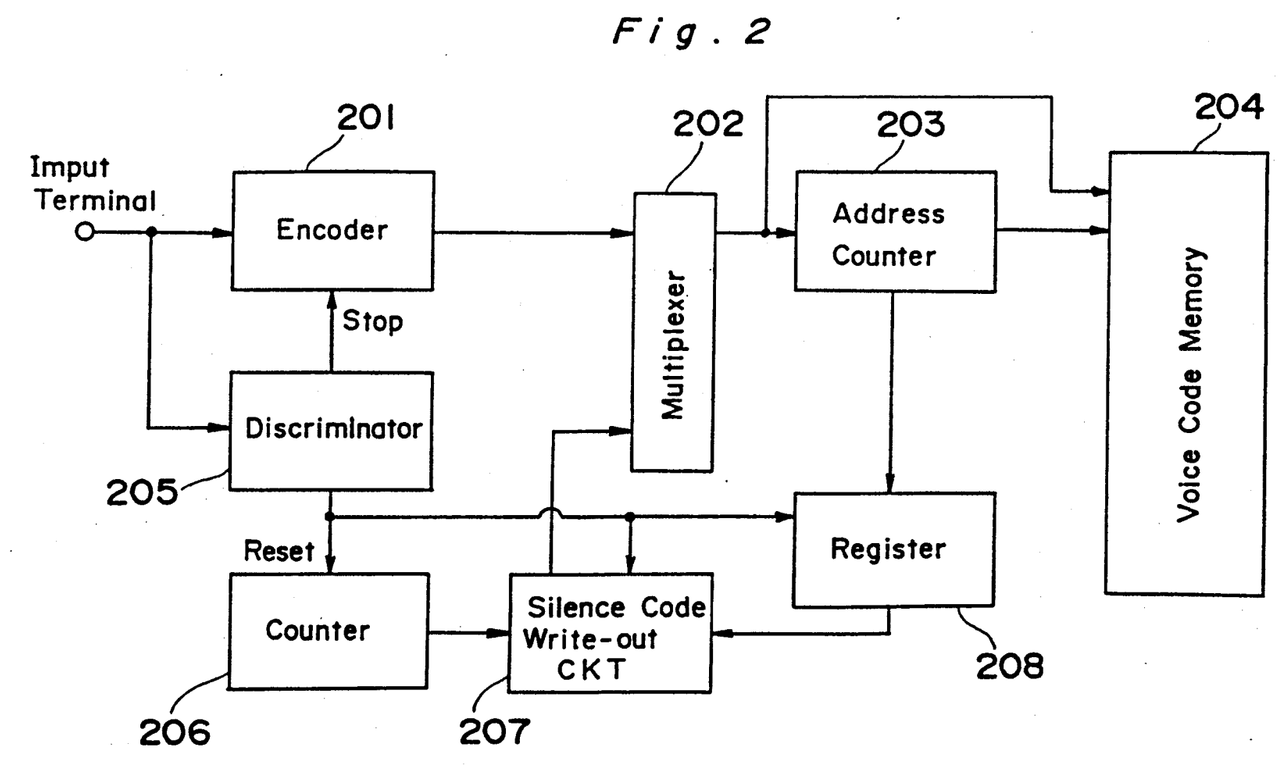
FIG. 2 is a schematic block circuit diagram showing a recording unit used in the voice recording and reproducing apparatus according to a second preferred embodiment of the present invention.

FIG. 2 illustrates a block circuit diagram of a recording unit of the voice recorder according to a second preferred embodiment of the present invention. The recording unit shown therein comprises an encoder 201, a multiplexer 202, an address counter 203, a voice code memory 204, a discriminator 205 for detecting the presence of a silent area or a voiced area, a counter 206, a silence code writeout circuit 207 and a register 208. The recording unit of the above described construction can perform not only the cueing function described in connection with the first preferred embodiment of the present invention, but also reverse cueing and fast-feed cueing functions, similar to those accomplished in a commercially available cassette tape player, on the basis of the silence code.

The reverse cueing and fast-feed cueing functions will now be described in detail.

Figure 4:
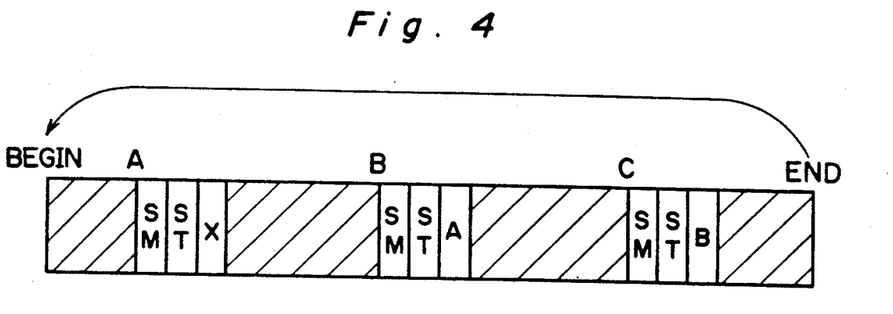
FIG. 4 is a schematic diagram showing the contents stored in a voice code memory which have recorded by the recording unit of FIG. 2.

The silent area included in the voice signal is coded into such a data structure as shown in FIG. 4 and is then stored in the voice code memory 204. The voice code memory shown in FIG. 4 is of a circulative type wherein the address immediately followed by an END point represents a BEGIN point. Referring to FIG. 4, hatched areas in the data structure shown therein represent respective standard voiced codes while blank area represent respective silence codes. The silence code is a structure wherein the following three pieces of information are combined together. The three pieces of information includes a special code SM indicative of the silent area, a time code ST indicative of the length of time during which the silent area is present, and an address value indicative of the address in the voice code memory 204 in which the previous silence code is written in.

The operation of the voice recorder of the above described operation which takes place during the recording mode will first be described. The voice signal supplied from an input terminal is supplied to the encoder 201 and also to the discriminator 205. When the discriminator 205 detects that the input voice is a voiced signal, the input voice signal is encoded by the encoder 201, followed by the storage in the voice code memory 203 in a manner similar to that described in connection with the first preferred embodiment of the present invention.

On the other hand, if the discriminator 205 detects the presence of the silent area in the input voice signal, the discriminator 205 generates an output signal necessary to reset the counter 206 for counting the length of time during which the silent area is present, so that the counter 206 can start its counting operation, and also a stop signal necessitated to cause the encoder 201 to interrupt an encoding operation. Should the discriminator 205 subsequently detect the presence of the voiced area in the input voice signal, the silence code write-out circuit 207 causes the special code SM indicative of the silent area, the time code ST indicative of the length of time during which the silent area is present, and the address value, loaded from the register 208, of the voice code memory 204 in which the silence code preceding the current silence code is written in (or the current address value, where the silence code is written in for the first time) to be written in the voice code memory 204. Thereafter, the register 208 is updated by the address value of the voice code memory 204 in which the current silence code is written, which has been supplied from the address counter 203, and waits for the next succeeding silence code to be inputted thereto.

The operation of the voice recorder according to the second preferred embodiment of the present invention which takes place during the reproducing mode will now be described.

Figure 3:
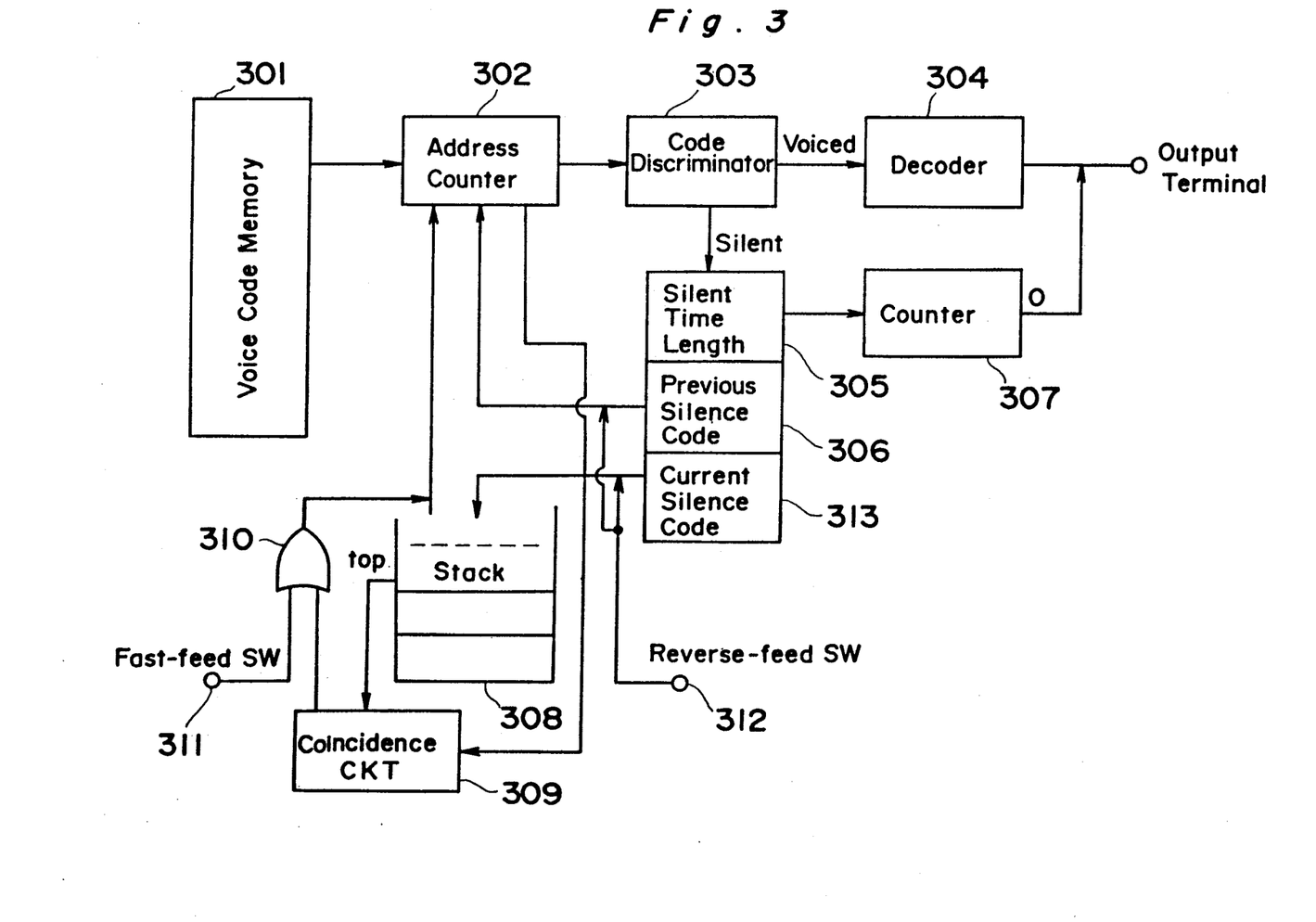
FIG. 3 is a schematic block circuit diagram showing a reproducing unit used in the voice recording and reproducing apparatus according to the second preferred embodiment or the present invention.

Referring to FIG. 3 showing a block circuit diagram of a reproducing unit of the voice recorder according to the second preferred embodiment of the present invention, the reproducing unit comprises a voice code memory 301, an address counter 302, a code discriminator 303, a decoder 304, a register 305 for the storage of the length of time during which the silent area is present, an address register 306 for the previous silence code, an address register 313 for the current silence code, a stack 308, a coincidence circuit 309 and an OR gate 310.

The cueing operation for specifying the point from which reproduction is to be performed is carried out in a manner similar to that in the first preferred embodiment of the present invention. To summarize it again, during the recording mode, the address in which the previous silence code has been written is stored at all times in the register 208 of the recording unit (which register 208 is identical with the address register 306 of the reproducing unit) and, when the reproduction is specified, the contents of the address register 306 are transferred into the address counter 302 thereby to initiate the reproduction and accomplish the reverse cueing at the time of reproduction.

The reverse cueing during the reproduction takes place in the following manner. Assuming that, in FIG. 4, the reproduction is specified at the time the recording has been made to the point END, the point from which the reproduction starts goes back to the point C as a result of the reverse cueing effected at the time of reproduction. In such case, the address of the point C supersedes the address in the address counter 302 of FIG. 3 with the reproduction consequently started. The code received from the voice code memory 301 is the silence code SM, and therefore, the code discriminator 303 determines that the code inputted thereto represents the silence code. The address value (C) of the current address counter 302 is supplied to and updates the address register 313 and the silent time length ST is inputted and updates the silent time length register 305 while the previous silence code address (B) is supplied to and updates the silence code address register 306.

Should a reverse switch 312 be depressed during the reproduction taking place, the address value (C) representative of the current silence code stored in the current silence code address register 313 is pushed to the stack 308, and at the same time, the address value (B) representative of the previous silence code stored in the previous silence code address register 306 is inputted to and updates the address counter 302 so that the reproduction can start from the point B. This can be applicable even, where the reverse switch 312 is operated a subsequent time thereto. In other words, the reverse cueing during the reproduction can be accomplished because the silence code accumulated in the voice code memory 301 represents a structure similar to a linked list.

However, the number of pieces which can be gone back during the reverse cueing is limited. By way of example, in FIG. 4, if the switch 312 is depressed to specify the reverse cueing while the reproduction is taking place from the point A, the reverse cueing will go back to the previous silence code address value (X) stored in the silence code of the point A. However, since the voice codes are circulatively written in the voice code memory 301, new voice code data was written in the point X, and therefore, the reverse cueing cannot be achieved. This can be checked in the following manner. Assuming that the voice code is written in the voice code memory 301 from a location of small address number to a location of large address number, the check can be expressed by the following formulas, provided that "STOP" represents the address at which the reproduction is specified, "CURRENT" represents the address of the current silence code, and "PREVIOUS" represents the address of the silence code to which the reverse is desired:

(I) When STOP$\leq$CURRENT;
(a) if STOP<PREVIOUS<CURRENT, the reverse is possible,
(b) or otherwise the reverse is not possible.
(II) When CURRENT<STOP;
(a) if CURRENT<PREVIOUS<STOP, the reverse is impossible,
(b) or otherwise the reverse is possible.

Hereinafter, the fast-feed cueing effected during the reproduction taking place will be described.

Figure 5:
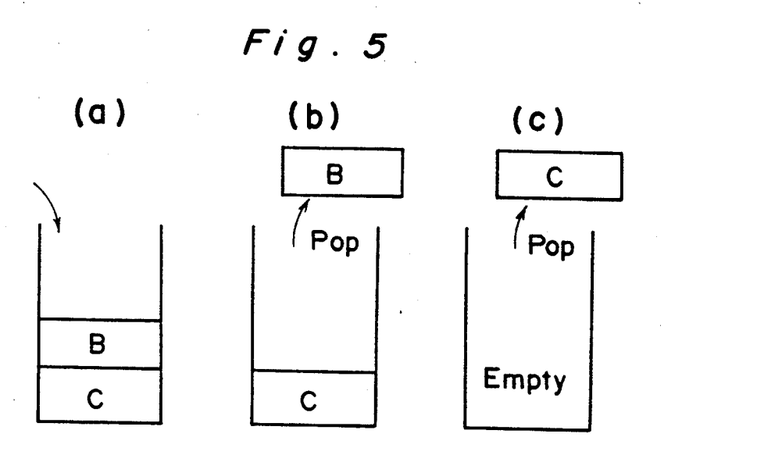
FIG. 5 is a schematic diagram showing the contents of a stack used in the recording unit shown in FIG. 3.

Assuming that, referring to FIG. 4, the recording has been made to the point END and the reproduction is then specified, and subsequently, the reverse switch 312 is operated two times to effect the reverse cueing two times, the content in the stack 308 will be such as shown in FIG. 5(a). In such case, the reproduction starts from the point A. If a fast-feed switch 311 is then depressed, a top element (B in this case) from the stack 308 is popped up and is supplied, and hence, updates the address counter 302 so that the reproduction can start from the point B, thereby realizing the fast-feed cueing. A similar description can applies even when the fast-feed switch 311 is operated a subsequent time thereto.

It is, however, to be noted that since the fast-feed cueing during the reproduction is accomplished by the use of the stack 308, it cannot be executed if the stack 308 is empty, that is, unless reverse cueing is executed during the reproduction. The fast-feed cueing and the reverse cueing are reverse in relationship.

The above described stack operation is not only to pop up the element during the fast-feed cueing, but also to pop up the element when, during the reproduction, the silence code is detected. In other words, referring to FIG. 4, the content of the stack at the time the reproduction is started from the point B subsequent to the above described operation is such as shown in FIG. 5(b). If the continued reproduction is subsequently executed, the silence code is detected at the point C. If this occurs, the cueing will no longer be executed from the point C by the fast-feed operation, and therefore, the popping of the stack 308 takes place when the address counter 302 and the value (C at this time) of the top of the stack 308 are determined as coinciding with each other by the coincidence circuit 309. Thereafter, the content of the stack becomes such as shown in FIG. 5(c). Should at this time the special code SM be detected by the code discriminator 303, the silent time length accumulated in the silent time, length register 305 is read out to the counter 307, and subsequently a zero value corresponding to the silent time length is outputted from the counter 307, thereby permitting the silence code to be reproduced.

In the manners described above, the reverse cueing during the reproduction being specified, the reverse cueing during the reproduction and the fast-feed cueing during the reproduction can be performed, respectively.

Figure 6:
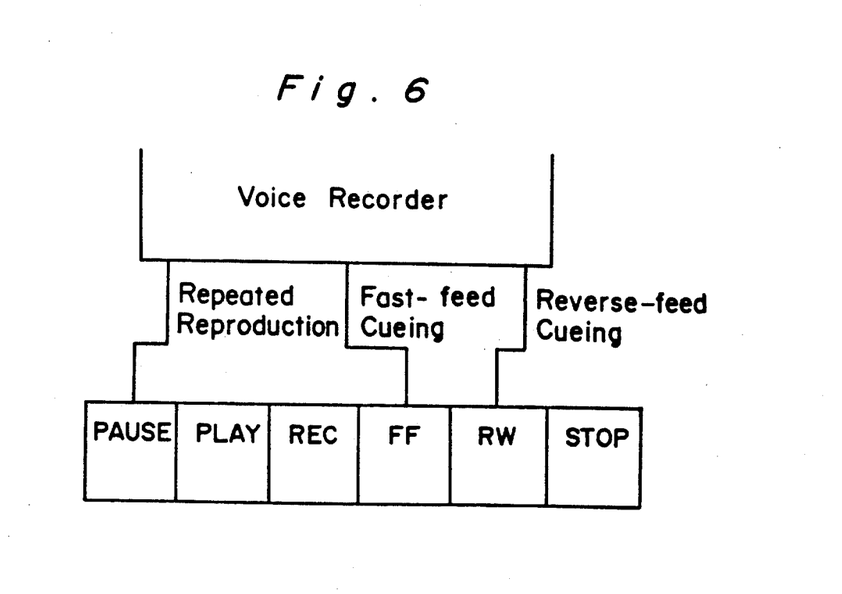
FIG. 6 is a schematic diagram showing the connection of the voice recording and reproducing apparatus of the present invention with a standard cassette tape recorder.

It is to be noted that the voice recorder of the present invention can be incorporated in the standard cassette tape player to accomplish the repeated recording and reproducing function. Where applied in the cassette tape player, the voice recorder of the present invention can be operated in the manner which will now be described. FIG. 6 illustrates various switches employed in the cassette tape player, which switches can be concurrently used for controlling the voice recorder of the present invention.

The operation of the cassette tape player will first be discussed briefly.

Figure 7:
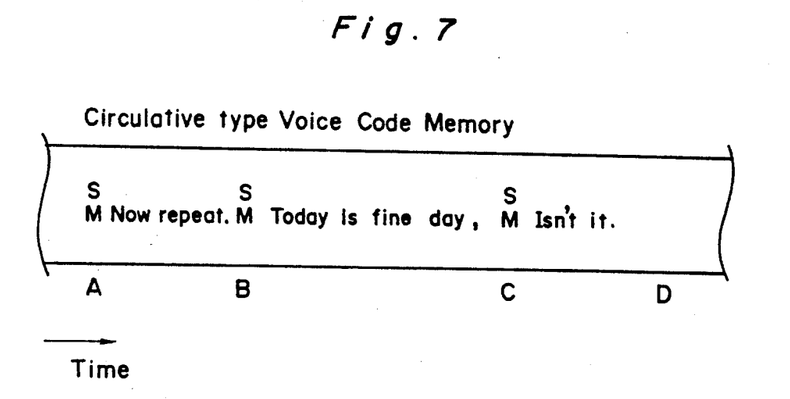
FIG. 7 is a schematic diagram showing the contents of the voice code memory recorded by the cassette tape recorder shown in FIG. 6.

During a normal playback of the tape player, the voice recorder of the present invention is operated in the recording mode in which the information so reproduced is recorded. If a PAUSE switch shown in FIG. 6 is depressed on this occasion, the recording tape is temporarily held still, and on the other hand, the voice recorder of the present invention starts the reproduction as a result of the reverse cueing that takes place when reproduction is specified. So long as the PAUSE switch is depressed, FF (fast forward) and RW (reverse) switches are disabled so that they will not function, as respective switches for controlling the recording tape, and instead, serve respectively as fast-feed cueing and reverse cueing switches for the voice recorder of the present invention. It is, however, to be noted that the each of FF and RW switches are preferably employed in the form of a momentary switch or the like.

Where information is recorded in the voice code memory in such a way as shown in FIG. 7 (wherein SM represents a series of silence codes as described above), the voice recorder of the present invention operates in the following manner. Assuming that the user is going to reproduce from the point B shown in FIG. 7, the following sequence of operation takes place from the instant that the repeated reproduction is specified.

(1) Upon depression of the PAUSE switch at the moment D, the repeated reproduction starts.
(2) According to reverse cueing process which takes place when reproduction is specified, the point C is resumed and the reproduction takes place from that point.
(3) Since the point C is not the point from which the user wishes to start the reproduction, a further reverse cueing process is specified by manipulating the RW switch.
(4) The reproduction is then initiated from the point B. If at this time the RW switch is erroneously depressed again, the point A is resumed and the reproduction takes place from that point A.
(5) The user will then realize that the reverse cueing is too much. In this case, the user will depress the FF switch to make the point B resumed from which the reproduction starts.
(6) Should none of RW and FF be subsequently specified until the point D, the point B will be deemed as the point from which the user wishes to effect the reproduction, and therefore, the reproduction actually takes place from this point B to the point D unless the PAUSE switch is released on the way.
(7) When the PAUSE switch is released, the repeated reproduction is interrupted and the reproduction of information from the recording tape is resumed, allowing the voice recorder of the present invention to record the information reproduced from the recording tape.

Figure 8:
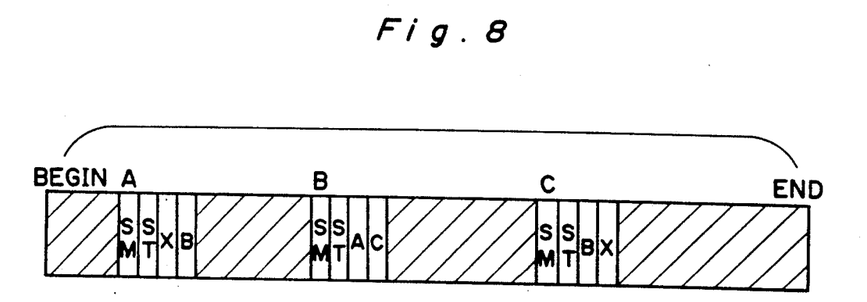
FIG. 8 is a schematic diagram showing the contents of the voice code memory recorded by a preferred embodiment of the present invention different from the first and second preferred embodiments thereof.

As described above, the second preferred embodiment of the present invention makes use of the stack 308. Therefore, if sufficient stack area is not available overflow may occur. This problem can be effectively avoided by structuring the silence code during the recording in the following manner as shown in FIG. 8.

Specifically, the silence code is so structured as to have the special code SM, the time code ST indicative of the length of time during which the silent area is present, the address value from which the preceding silence code has been outputted, and the address value from which the next succeeding silence code is to be outputted. The last mentioned element, that is, the address value from which the next succeeding silence code is to be outputted, will not be determined immediately at that time and will be determined when the next succeeding silence code is actually inputted. Therefore, the process during the recording may become complicated; however, the employment of the code structure of a type having this bidirectional link list of addresses for the previous and subsequent silence codes completely eliminates the use of the stack during the reproduction.

As fully described above, the voice recorder according to the first preferred embodiment of the present invention is designed so that, at the time the coded voice signal is to be circulatively stored at addresses of the voice code memory specified by the address counter, the address values of the address counter are stored in the register when the discriminator indicates that the signal indicative of the presence of the silent area has changed to the signal indicative of the presence of the voiced area. Accordingly, when the reproduction is specified, reverse curing takes place back to the address value representative of the position at which the signal indicative of the presence of the silent area has changed to the signal indicative of the presence of the voiced area so that the reproduction can take place from such address value. Therefore, it will not occur that the start of reproduction may takes place in the interim of speech.

On the other hand, the voice recorder according to the second preferred embodiment of the present invention is designed so that, at the time the coded voice signal is to be circulatively stored at addresses of the voice code memory specified by the address counter when the discriminator indicates the signal indicative of the presence of the silent area, the operation of the encoder is interrupted to permit the measurement of the length of time during which the silent area is present. But when the discriminator indicates that the signal indicative of the presence of the silent area has changed to the signal indicative of the presence of the voiced area, a silence code consisting of a code indicative of the silent signal, the length of time during which the silent area is present and the address value of the voice code memory at which the previous silence code is stored is written in the voice code memory by the silence code write-out means. Accordingly, at the time of reproduction, based on the information including the address value accumulated in the register and the silence code written in the voice code memory, the reverse cued reproduction and fast-feed cued reproduction of the voice can be accomplished, and it will not occur that the start of reproduction may takes place in the interim of speech, enabling the user to accomplish the voice reproduction from the intended position through a very simple manipulating procedure.

Although the present invention has been fully described in connection with the preferred embodiments thereof with reference to the accompanying drawings, it is to be noted that various changes and modifications may be apparent to those skilled in the art. Such changes and modifications are to be understood as included within the scope of the present invention as defined by the appended claims unless they depart therefrom.

What is claimed is:

1. A voice recording and reproducing apparatus comprising:

input means for inputting instructions concerning recording operations or reproducing operations;

voice encoder means for encoding an inputted voice signal into a voice code;

address counter means, operatively connected to said voice encoder means, for producing an address value of said voice code;

circulatory voice code memory means, operatively connected to said address counter means, for circulatively storing said voice code at said address value specified by said address counter means;

discriminator means responsive to the inputted voice signal for determining whether said inputted voice signal is a voiced signal or whether said inputted voice signal is a silent signal and generating a first output signal when a silent signal follows a voiced signal;

register means, operatively connected to said address counter and said discriminator means, for receiving and storing said address value of said address counter means when said discriminator means indicates that a silent signal has changed into a voiced signal;

coincidence circuit means coupled to said address counter means and said register means for detecting the coincidence between the respective count value of said address counter means and the count value of said register means and generating a second output signal when coincidence occurs, thereby indicating the absence of a silent signal in said inputted voice signal;

bistable circuit means coupled to said discriminator means and said coincidence circuit means and being set by said first output signal and reset by said second output signal;

whereby said address value stored in said register means is inputted into an address counter associated with reproduction operations when said bistable circuit is set, such that when a reproduction instruction is subsequently inputted, a reproduction operation starts at said address value to thereby reproduce said voiced signal.

2. A voice recording and reproducing apparatus comprising:

input means for inputting instructions to control operations of the recording and reproducing apparatus;

voice encoder means for encoding an inputted voice signal into a voice code;

address counter means, operatively connected to said voice encoder means, for producing an address value for said voice code;

voice code memory means, operatively connected to said voice encoder means and said address counter means, for circulatively storing said voice code at said address value specified by said address counter means;

discriminator means for determining whether said inputted voice signal is a voiced signal or whether said inputted voice signal is a silent signal and generating a first control signal coupled to said voice encoder means for interrupting operation of said voice encoder means when said discriminator means indicates that said inputted voice signal is a silent signal;

second counter means operatively connected to said discriminator means and being responsive to a second control signal generated by said discriminator means for counting the length of time a silent signal is present;

register means, operatively connected to said address counter means and said discriminator means, for storing said address value of said address counter means when said discriminator means indicates that said inputted voice signal has changed from a silent signal to a voiced signal;

and silence code write-out circuit means, operatively connected to said discriminator means, to said second counter means and to said register means for generating and writing a silence code into said voice code memory means, said silence code having a first code portion for indicating that said inputted voice signal is said silent signal, a second code portion indicative of the length of time said silent signal is present and an address value indicative of the address value of the immediate preceding silence code stored in said register means prior to said discriminator means determining that said inputted voice signal had changed from said silent signal to said voiced signal, whereby during a reproduction, a reverse cued reproduction and a fast-feed cued reproduction of a voiced signal is generated on the basis of information of the silence code written in the voice code memory and the address value of said preceding code accumulated in the said register means.

3. The apparatus as claimed in claim 1, wherein said voice code memory means is a non-volatile memory.

4. The apparatus as claimed in claim 1, wherein said voice code memory means is a continuous magnetic tape.

5. The apparatus as claimed in claim 1 further comprising:

detection means, operatively connected to said address counter means and said register means, for determining whether a previously recorded silent signal has been recorded over by a new voiced signal, thereby enabling a reproduction operation to start at an address immediately following said address value in said address counter means when said previous recorded silent signal has been recorded over by said new voiced signal.

6. The apparatus as claimed in claim 2, wherein said voice code memory means is a non-volatile memory.

7. The apparatus as claimed in claim 2, wherein said voice code memory means is a continuous magnetic tape.

8. A method for recording and reproducing information using a recording a reproducing apparatus, comprising the steps of:

(a) inputting instructions to control operations of the recording and reproducing apparatus;

(b) inputting a signal to be recorded;

(c) encoding the inputted signal into a voice code;

(d) producing an address value for the voice code by using an address counter;

(e) circulatively storing the voice code at a location in a recording medium corresponding to the address value of said address counter;

(f) determining if the voice code represents a silent signal or a voiced signal using a voice code discriminator;

(g) storing the address value from the address counter in a memory device when said step (f) determines that a silent signal has changed to a voiced signal thereby determining the time duration of the silent signal;

(h) inputting the address value stored in the memory device into the address counter when a reproduction instruction is inputted; and (i) starting the reproduction operation at the address value present in the address counter, thereby starting the reproduction operation at the address of the voiced signal.

9. The method as claimed in claim 8 further comprising the steps of:

(j) storing a code in the recording medium indicating that the voice code is the silent signal when said step (f) determines that a silent signal has been changed to a voiced signal;

(k) measuring a length of time representing a length of time that the silent signal is present;

(l) storing the measured length of time in the recording medium when said step (f) determines that a silent signal has been changed to a voiced signal; and (m) storing the address value stored in the memory device in the recording medium when said step (f) determines that a silent signal has been changed to a voiced signal.

10. The method as claimed in claim 8 further comprising the steps of:

(j) determining whether a previously recorded silent signal has been recorded over by a new voiced signal;

(k) preventing execution of said steps (h) and (i) when said step (j) determines that the previously recorded silent signal has been recorded over by a new voiced signal; and (l) starting a reproducing operation at an address immediately following the address value in the address counter when a reproduction instruction is inputted and a previously recorded silent signal has been recorded over by a new voiced signal.

* * * * *